United States Patent [19]
Miura

[11] Patent Number: 5,546,001
[45] Date of Patent: Aug. 13, 1996

[54] SWITCHING SIGNAL GENERATOR AND MAGNETIC RESONANCE IMAGING SYSTEM USING THE SAME

[75] Inventor: Motohiro Miura, Otawara, Japan

[73] Assignee: Kabushiki Kaisha Toshiba, Kawasaki, Japan

[21] Appl. No.: 134,273

[22] Filed: Oct. 8, 1993

[30] Foreign Application Priority Data

Oct. 8, 1992  [JP]  Japan .................................. 4-270339

[51] Int. Cl.⁶ .................................................. G01V 3/00
[52] U.S. Cl. ........................ 324/322; 324/318; 128/653.5
[58] Field of Search ................................ 324/322, 318, 324/314, 307, 309, 300; 128/653.5

[56] References Cited

U.S. PATENT DOCUMENTS

| | | | |
|---|---|---|---|
| 4,733,342 | 3/1988 | Mueller et al. | 324/322 |
| 5,227,728 | 7/1993 | Kaufman et al. | 324/322 |
| 5,270,657 | 12/1993 | Wirth et al. | 324/322 |
| 5,347,222 | 9/1994 | Fox et al. | 324/322 |

FOREIGN PATENT DOCUMENTS

3-77739  12/1991  Japan .

*Primary Examiner*—Louis M. Arana
*Attorney, Agent, or Firm*—Limbach & Limbach L.L.P.; Ronald L. Yin

[57] ABSTRACT

There provided is a switching signal generator mounted in a system for handling a signal of a predetermined frequency band. A magnetic resonance imaging (MRI) system is one of the preferred systems. The generator comprises an element for supplying a switching signal of a switching frequency to a switching device mounted in the system and operated by pulse width modulation, the switching frequency being able to be changed in response to a control signal. The generator further comprises an element for adjusting the switching frequency by supplying the control signal to the switching signal supplying element so that a frequency which is product of the switching frequency and an integer falls out of the predetermined frequency band. In case of the MRI system, the predetermined frequency band is an image frequency band. As a result, the so-called F1 noise can be avoidable from the image.

9 Claims, 7 Drawing Sheets

SWITCHING SIGNAL GENERATOR AND MAGNETIC RESONANCE IMAGING SYSTEM USING THE SAME

BACKGROUND OF THE INVENTION

The present invention relates to a switching frequency generator for supplying a switching frequency, and more particularly to a switching frequency generator suitable for use in a PWM (Pulse Width Modulation) type switching device, and a magnetic resonance imaging (MRI) system using the same, which is, for example, a PWM type gradient power source or clock circuit of an MRI system.

In magnetic resonance imaging, an object to be diagnosed is placed in a static magnetic field, whereby atomic nuclei align themselves with the static magnetic field. Then gradient magnetic fields in three x-, y- and z-directions are applied to the object for spatially encoding and a radio frequency (RF) signal is applied to the object for exciting the atomic nuclei in a magnetically sliced plane, which has a certain thickness in a slicing direction, of the object. When the RF signal is removed, magnetic resonance (MR) signals emitted from the sliced plane can be collected. A series of the excitation and MR signal acquisition is performed on a predetermined pulse sequence. The collected MR signals are then processed, for example, by Fourier transformation to form image data of the magnetically sliced plane of the object.

An MRI system, which is generally used and carries out the above procedure, has a gradient power source to supply power to gradient coils. Thus gradient magnetic fields are applied to an object through the coils.

One type of the gradient power source uses a pulse width control system. Such gradient power source has, for example, an operation circuit for computing the difference between a reference voltage signal and a detected voltage signal detected as the representative of a gradient magnetic field current. A PWM circuit varies a duty ratio by using the output of the operation circuit, a switching circuit which is turned on and off by the output of the PWM circuit, and a smoothing circuit connected between the switching circuit and the gradient coils. Among these circuits, the PWM circuit includes an external oscillator or an internal oscillator and conducts a pulse width control by using the oscillation output as a synchronizing signal. In this case, the oscillation frequency of the external or internal oscillator is fixed.

Figure 1:
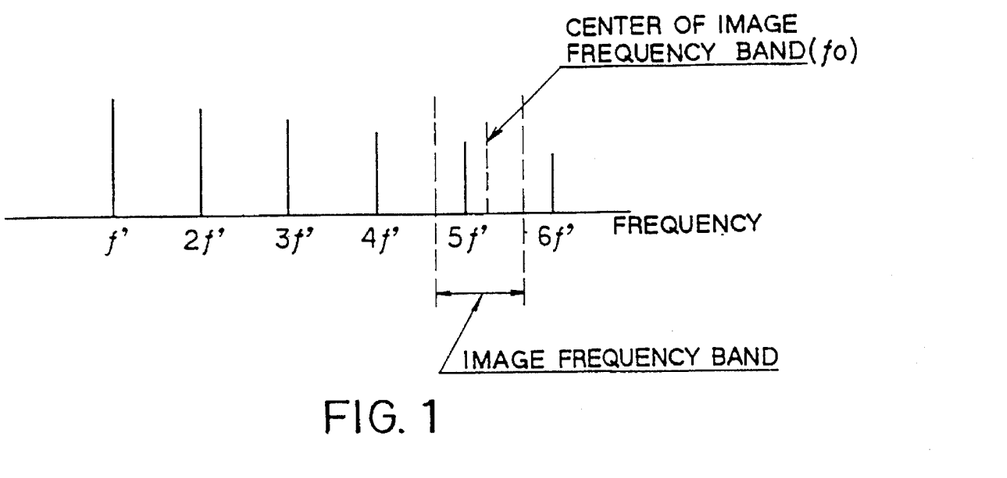
FIG. 1 is an illustration of the frequency spectrum showing an image frequency band in a conventional system.

In general, a circuit which performs switching operation, e.g., the above-mentioned PWM circuit, produces an output which inherently contain higher harmonics of frequencies which is multiples of the basic frequency. Such higher harmonics often causes noise. This is attributable to the fact that an MRI system, in a resonance frequency band of a measuring object such as hydrogen in the magnetic field, is equivalent to a receiver having very high sensitivity. For instance, representing the resonance frequency of an MRI system by $f_0$, while representing the switching frequency by $f'$, a higher harmonic or harmonics (5f' in the illustrated case) may fall within the image frequency band whose center frequency is the resonance frequency $f_0$ as shown in FIG. 1. In such a case, a linear artifact called "F1 noise" is generated in the MRI reconstructed image.

The gradient power source of the pulse width control type, of the prior art however, cannot avoid generation of F1 noise, due to the fact that the frequency of the synchronizing signal supplied to the PWM circuit is fixed as stated before.

The F1 noise attributable to the spurious characteristic would be avoided if the switching system is not used. Such a solution, however, requires a large-sized expensive series regulator or shunt regulator, and the gradient power source to be of linear type which is low in efficiency.

Figure 2:
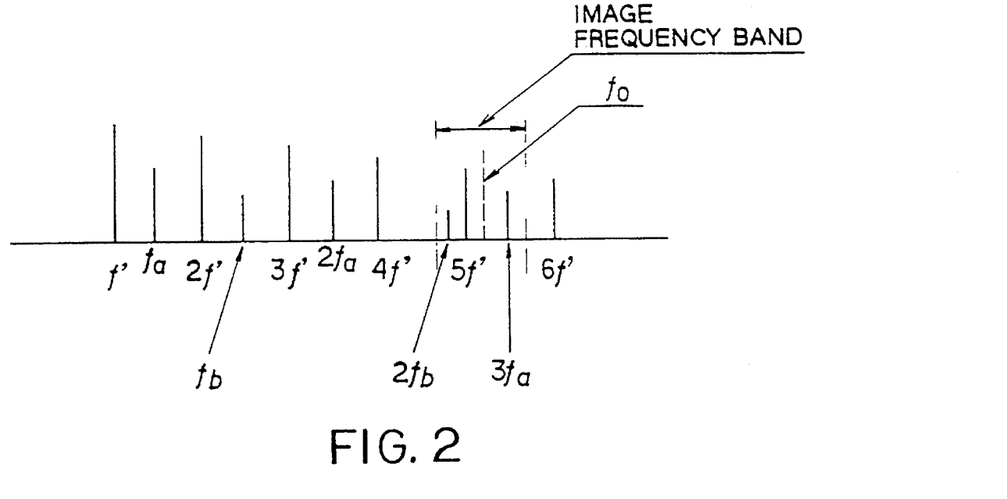
FIG. 2 is an illustration of the frequency spectrum showing an image frequency band in another conventional system.

In the known MRI system, the F1 noise attributable to spurious characteristic is caused not only by a switching unit such as the gradient power source but also by clock units of digital circuits. In addition, since frequencies are independently determined for different units, a plurality of higher harmonics $5f'$, $3f_a$, $2f_b$, come into the image frequency band so as to form a plurality of linear F1 noises, as shown in FIG. 2.

SUMMARY OF THE INVENTION

Accordingly, it is a primary object of the present invention to provide a switching signal generator that is adequate to prevent noise which may occur due to higher harmonic components of its switching frequency falling within a specific frequency band.

It is a further object of the present invention to provide an MRI system incorporating a switching signal generator that supplies a switching signal to a gradient power source and altering its switching frequency so as to adequately prevent noise which may occur due to higher harmonic components of switching frequency falling within an image frequency band.

These and other objects can be achieved according to the present invention, in one aspect by providing, a switching signal generator mounted in a system for handling a signal of a predetermined frequency band. The generator comprises an element for supplying a switching signal of a switching frequency to a switching device mounted in the system. The switching frequency is able to be changed in response to a control signal. An element for adjusting the switching frequency supplies the control signal to the switching signal supplying element so that a frequency, which is the product of the switching frequency and an integer, produces the predetermined frequency band.

These and other objects can be achieved according to the present invention, in another aspect by providing, a magnetic resonance imaging system having a predetermined frequency band. The system comprises a switching device operating in response to a switching signal of a switching frequency. A switching signal generator supplies the switching signal to the switching device, wherein, the switching signal generator comprises an element for supplying the switching signal to the switching device. The switching frequency is able to be changed in response to a control signal. A element for adjusting the switching frequency supplies the control signal to the switching signal supplying element so that a frequency which is product of the switching frequency and an integer falls out of the predetermined frequency band.

It is preferred that the predetermined frequency band is an image frequency band. The switching device operates by pulse width modulation. Further, the switching device has at least one power source, an amplifier and a logic circuit operating in response to the switching signal. Preferably, the power source is a gradient power source.

It is also preferred that the switching frequency adjusting element has a modulation circuit adopting a ring modulation and a frequency divider circuit dividing the output of the modulation circuit into a synchronizing signal as the control signal. The modulation circuit is a circuit adopting a ring modulator.

It is also preferred that the switching frequency adjusting element has a phased locked loop circuit and a frequency divider circuit dividing the output of the phased locked loop circuit into a synchronizing as the control signal.

Further, it is preferred that the switching frequency is larger than frequencies of the image frequency band.

Still further, it preferred that the switching frequency adjusting means is a manually-operated device. Preferably, the device is a manually-operated switch.

BRIEF DESCRIPTION OF THE DRAWINGS

The accompanying drawings which are incorporated in and constitute a part of this specification, illustrate embodiments of the present invention and, together with the description, serve to explain the principles of the present invention. In the drawings.

DESCRIPTION OF THE PREFERRED EMBODIMENTS

Embodiments of the present invention will now be described with reference to the accompanying drawings. In the following embodiments, a switching signal generator of the present embodiment will be applied to a magnetic resonance imaging (MRI) system, but it is not limited to the MRI system.

Figure 3:
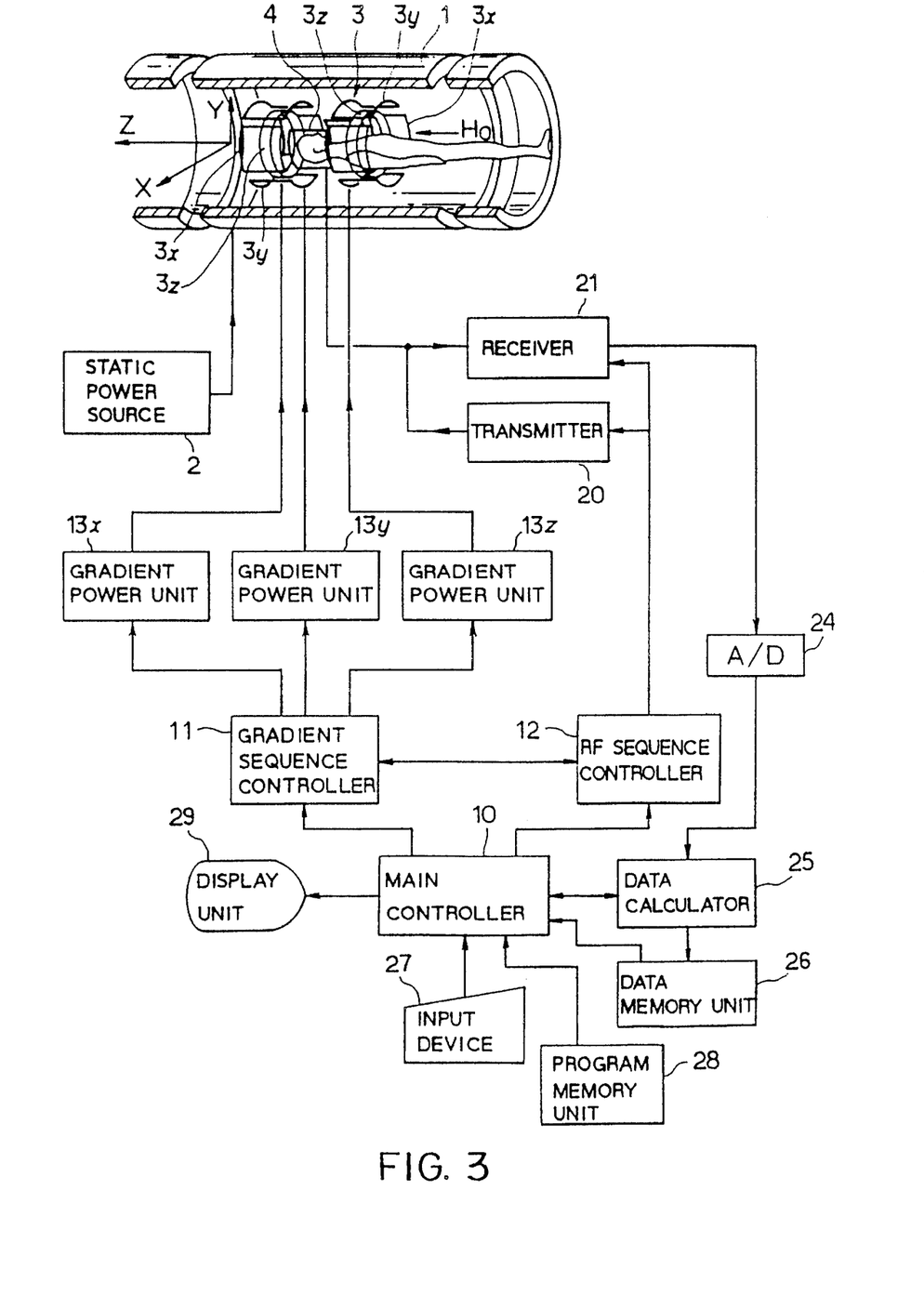
FIG. 3 is a block diagram of an MRI system in accordance with a first embodiment of the present invention.

A first embodiment of the present invention will now be described with reference to FIGS. 3 to 5. FIG. 3 is a block diagram schematically representing the whole construction of an MRI system of the first embodiment.

The MRI system shown in FIG. 3 comprises a magnet 1 generally formed into a cylinder shape having a hollow portion therein for placing a patient P, and a static power source 2 for supplying required electric current to the magnet 1. When the magnet 1 begins to work, a static field, having a uniform magnetic strength $H_0$ and being directed in Z-direction along the body axis of the patient P, is formed in the central diagnostic space in the hollow portion of the magnet 1.

In the hollow portion of the magnet 1, there is provided a gradient coil portion 3. The gradient coil portion 3 includes two pairs of x-coils 3x . . . 3x for generating a field gradient in X-direction, two pairs of y-coils 3y . . . 3y for generating a field gradient in Y-direction, and one pair of z-coils 3z and 3z for generating a field gradient in Z-direction.

An RF coil 4 is disposed in the inner space of the magnet 1, whereby the patient P inserted into the inner space is surrounded by the RF coil 4 and the gradient coils 3x . . . 3z. The RF coil 4 is in charge of transmitting and receiving radio frequency(RF) magnetic pulses to and from the patient P.

The MRI system is also provided with a main controller 10 controlling the entire system, a gradient sequence controller 11 controlling the pulse sequences to the field gradients, an RF sequence controller 12 controlling the pulse sequence to the RF signal. The main controller 10 comprises a computer for controlling the entire system. The main controller 10 is able to send a start signal and a stop signal of the pulse sequences to the controllers 11 and 12.

The gradient sequence controller 11 is also provided with a computer which stores programs of pulse sequences including a multi-slice and a gradient field echo process, for example. In response to the start signal from the main controller 10, the gradient sequence controller 11 is to supply, through a gradient power sources 13x to 13z, pulsed currents to the x-coils 3x . . . 3x, y-coils 3y . . . 3y, and z-coils 3z and 3z, respectively, according to a given sequence.

As shown in FIG. 3, the RF sequence controller 12 is connected to the RF coil 4 by way of a transmitter 20 and a receiver 21. The transmitter 20 is designed to supply a radio frequency(RF) pulsed current to the RF coil 4, thus a high frequency magnetic field generated from the RF coil 4 being sent to a diagnostic portion of the patient P. MR signals emitted from the diagnostic portion of the patient P can be detected by the RF coil 4 and received by the receiver 21 through control of the RF sequence controller 12.

The received MR signals are sent, by way of an analogue to digital converter 24, to a data calculator 25 to be reconstructed therein into corresponding image data with Fourier transformation, for example. The image data thus-reconstructed is designed to be stored in a data memory unit 26.

The main controller 10 is also connected to an input device 27, a program memory unit 28, and a display unit 29. The reconstructed image data can be supplied, through the main controller 10, to the display unit 29. The program memory unit 28 stores a procedure from positioning to scanning. This procedure is to be taken into a work area of the main controller 10, when the present MRI system is started.

Figure 4:
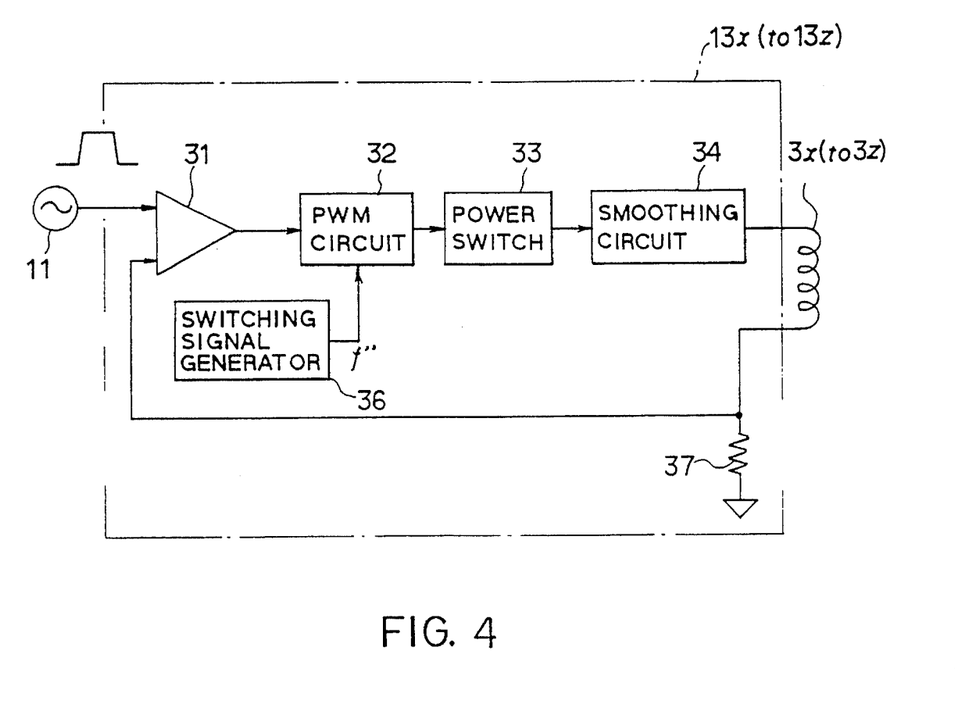
FIG. 4 is a block diagram of a gradient power source in accordance with the first embodiment.

Each of the switching signal generators 13x to 13z adopts a ring modulator as shown in FIG. 4. It is assumed here that the intensity of the magnetic field of the apparatus is 1.5T and that the resonance frequency $f_0$ is 63.9 MHz. It is also assumed that the rated switching frequency f of the PWM type gradient power sources 13x to 13z is 100 KHz. According to the invention, when the condition is such that the aforementioned F1 noise is produced when the gradient power sources 13x to 13z operated at the rated switching frequency f', the switching frequency is converted from f' to a new frequency f" and the PWM operation is executed at the switching frequency f".

According to the invention, the conversion of the frequency is conducted in accordance with the following equations. If the resonance frequency of the MRI system is represented by $f_0$ and the PWM switching frequency which affects the image is represented by f', a switching synchronizing signal is formed on the basis of a new frequency f" determined by the following equation (1) or (2). The switching is performed by using this synchronizing signal.

$$f'' = \{(f'/2) + f_0\} \times (f'/f_0) \quad (1)$$

$$f'' = \{f_0 - (f'/2)\} \times (f'/f_0) \quad (2)$$

Equation (1) and (2) have been worked out so that the higher harmonic components which are multiples of the switching frequency f", i.e., product of f" and integers do not fall within an image frequency band whose center frequency is the resonance frequency $f_0$. Either equation may be used for the determination of the frequency f". It is, however, to be noted the condition of the switching frequency f" being greater than the image frequency band width is met.

FIG. 4 illustrates an example of one of the gradient power sources 13x to 13z of PWM control type of the MRI system. The three gradient power sources 13x to 13z are the same in construction.

Each of the gradient power sources 13x to 13z is provided at its input side with an error amplifier 31 that receives an RF signal of rectangular waveform in accordance with a given sequence from the gradient sequence controller 11. The error amplifier 31 compares the RF input signal of rectangular waveform with a detection signal which is a voltage value detected as indication of the electric current in the gradient magnetic field. The output of the error amplifier 31 is connected to one end of the gradient coil 3x (to 3z) through a PWM circuit 32, power switch 33 and a smoothing circuit 34. The PWM circuit 32 receives a synchronizing signal of the switching frequency f" supplied from the switching signal generator 36 and sets the switching frequency in accordance with this synchronizing signal. The gradient coil 3x (to 3z) is connected, at its other end, to a voltage detecting resistor 37. The voltage across the resistor 17 is supplied to one of the input terminals of the error amplifier 31 as stated before.

As a consequence, the coil current supplied to the gradient coil 3x (to 3z) is detected in term of voltage value, and the waveform of this voltage is compared with the input voltage waveform by the error amplifier 31. If any difference in the waveform is detected between these voltages, an error voltage is supplied from the error amplifier 31 to a PWM circuit 32, so that the duty ratio of the circuit is fed-back for controlling purpose. As a result, a current flows through the gradient coil 3x (to 3z) corresponding to the reference signal supplied from the gradient sequence controller 11.

Figure 5:
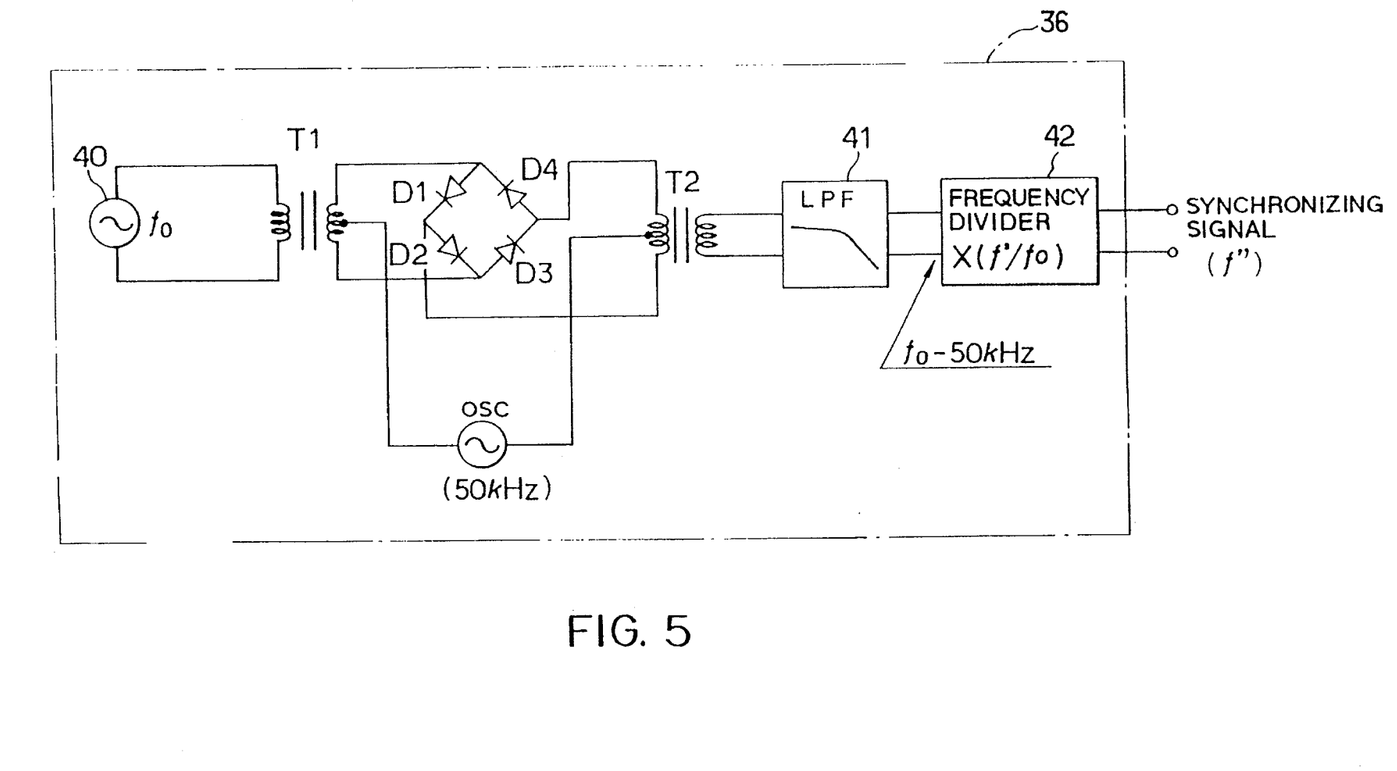
FIG. 5 is a block diagram of a switching signal generator used in the first embodiment.

As shown in FIG. 5, the switching signal generator 36 receives the output of a synthesizer 40 of the MRI system. The synthesizer 40 supplies an RF signal of the resonance frequency $f_0$. The switching signal generator 36 has a ring modulator which includes input and output transformers, T1, T2, four rectifiers D1 to D4 connected between the transformers T1 and T2, a reference oscillator OSC connected to the transformers T1 and T2, and an LPF (Low-Pass Filter) 41 connected to the secondary coil of the output transformer T2. The switching signal generator 36 also has a frequency divider 42 which performs demultiplication or frequency division of the output of the LPF 41 by a value corresponding to (f'/f$_0$) (divided by 639 in this case). If the value f'/f$_0$ is not an integer, an integer approximating such a value of f'/f$_0$ may be used instead. The frequency of the reference signal oscillated by the reference oscillator OSC is set to 50 KHz in this case.

Consequently, two components ($f_0$+50 KHz) and ($f_0$−50 KHz) appear on the secondary coil of the output transformer T2. The component of the higher frequency ($f_0$+50 KHz) is cut by the LPF 21. Consequently, a synchronizing signal having a frequency ($f_0$−50 KHz) is obtained as the output from the switching signal generator 16, and frequency ($f_0$−50 KHz) of this synchronizing signal divided by the computation of the aforementioned equation (2), is performed. The synchronizing signal of the frequency {($f_0$50 KHz)×(1/639)} thus obtained is supplied to the PWM circuit 32 of the aforesaid gradient power source 13x (to 13z).

Figure 6:
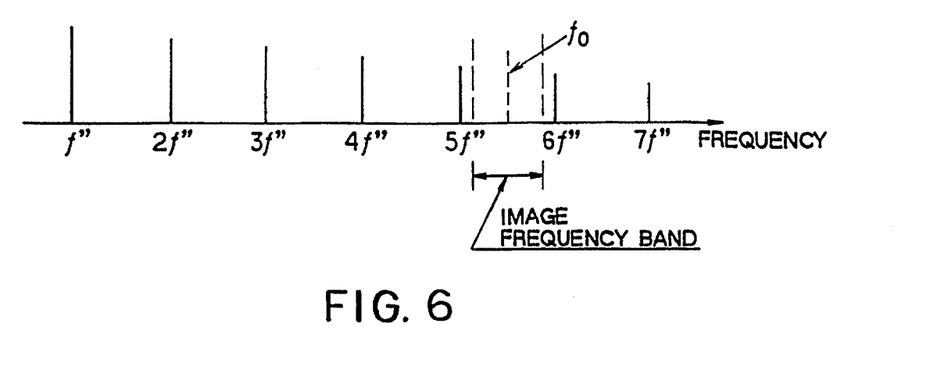
FIG. 6 is an illustration of the frequency spectrum in the first embodiment.

As a result, the switching frequency of the PWM circuit 32 is converted automatically from the rated value f'=100 KHz to f"={($f_0$50 KHz)×(1/639)}, whereby the PWM control is performed with the frequency f" which is slightly deviated from the rated frequency f'. The frequencies of the higher harmonics, which are products of the new switching frequency f" and integers, fall out of the image frequency band centered at the resonance frequency $f_0$, as represented in FIG. 6.

Thus, the frequencies of noises attributable to the higher harmonics are forcibly shifted outside the image frequency band, so that the reconstructed image is free of the F1 noises which hitherto have inevitably appeared in the image. It is therefore possible to improve S/N ratio and, hence, the quality of image, merely by addition of a simple arrangement for slightly shifting the switching frequency, without requiring specific parts such as noise-elimination filter, i.e., without significantly increasing the scale of the circuit.

A second embodiment of the present invention will be described with reference to FIG. 7. In this Figure, the same reference numerals are used to denote the same or equivalent components to those used in the first embodiment and detailed description of such components is omitted.

The second embodiment employs a switching signal generator 36 having a different construction from that of the generator used in the first embodiment.

Figure 7:
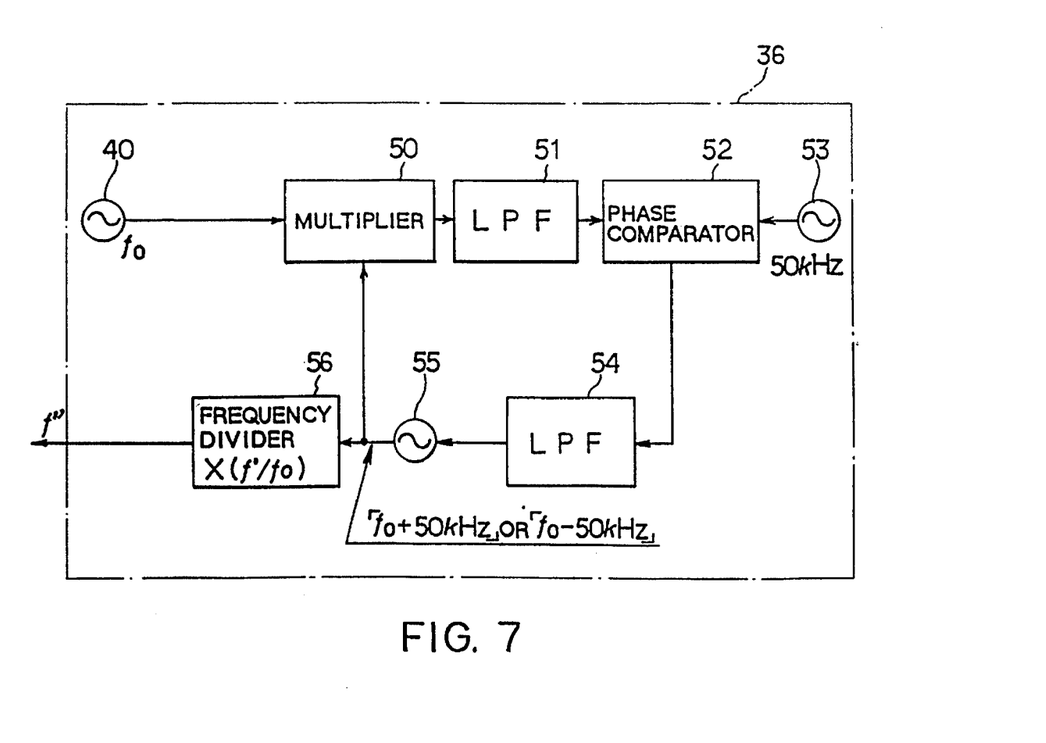
FIG. 7 is a block diagram of a switching signal generator in accordance with a second embodiment of the present invention.

More specifically, the switching signal generator 36 used in the second embodiment has a multiplier 50 which includes a 2-input modulator, as shown in FIG. 7. One of the input terminals of the multiplier 50 receives an RF signal of the resonance frequency $f_0$ from the synthesizer 20 in the main part of the system. The output terminal of the multiplier 50 is connected through an LPF 51 to one of the inputs of a 2-input phase comparator 52. The other input of the phase comparator 53 receives a reference signal of 50 KHz supplied by a reference oscillator 53.

The phase difference between both signals is output from the phase comparator 52 in the form of a D.C. voltage, and is supplied to a voltage control oscillator (VCO) 55 through another integrating LPF 54. The voltage control oscillator 55 oscillates a frequency which corresponds to the voltage supplied thereto, which is around $f_0$. The oscillation frequency is supplied to the other input of the multiplier 50, and is supplied also to the PWM circuit 32 through a frequency divider 56 which performs division by a value corresponding to "f'/f$_0$"divided by 639 in this case).

It is thus possible to form a phased locked loop (PLL) between the voltage control oscillator 55 which oscillates a frequency around $f_0$ and the reference signal derived from the reference oscillator 53. Consequently, the voltage control oscillator 55 oscillates a signal of a frequency ($f_0$×50 KHz) or ($f_0$50 KHz), whereby a synchronizing signal in accordance with the equation (1) or (2) is derived from the frequency divider 56. Whether the frequency of the synchronizing signal accords with the equation (1) or the equation (2) depends on the characteristic of the phase comparator 52.

Thus, the second embodiment produces the same effect as the first embodiment.

A third embodiment of the present invention will be described with reference to FIGS. 8. and 9. In these figures, the same reference numerals are used to denote components which are the same as or equivalent those in the first embodiment, and detailed description of such components is omitted.

Figure 8:
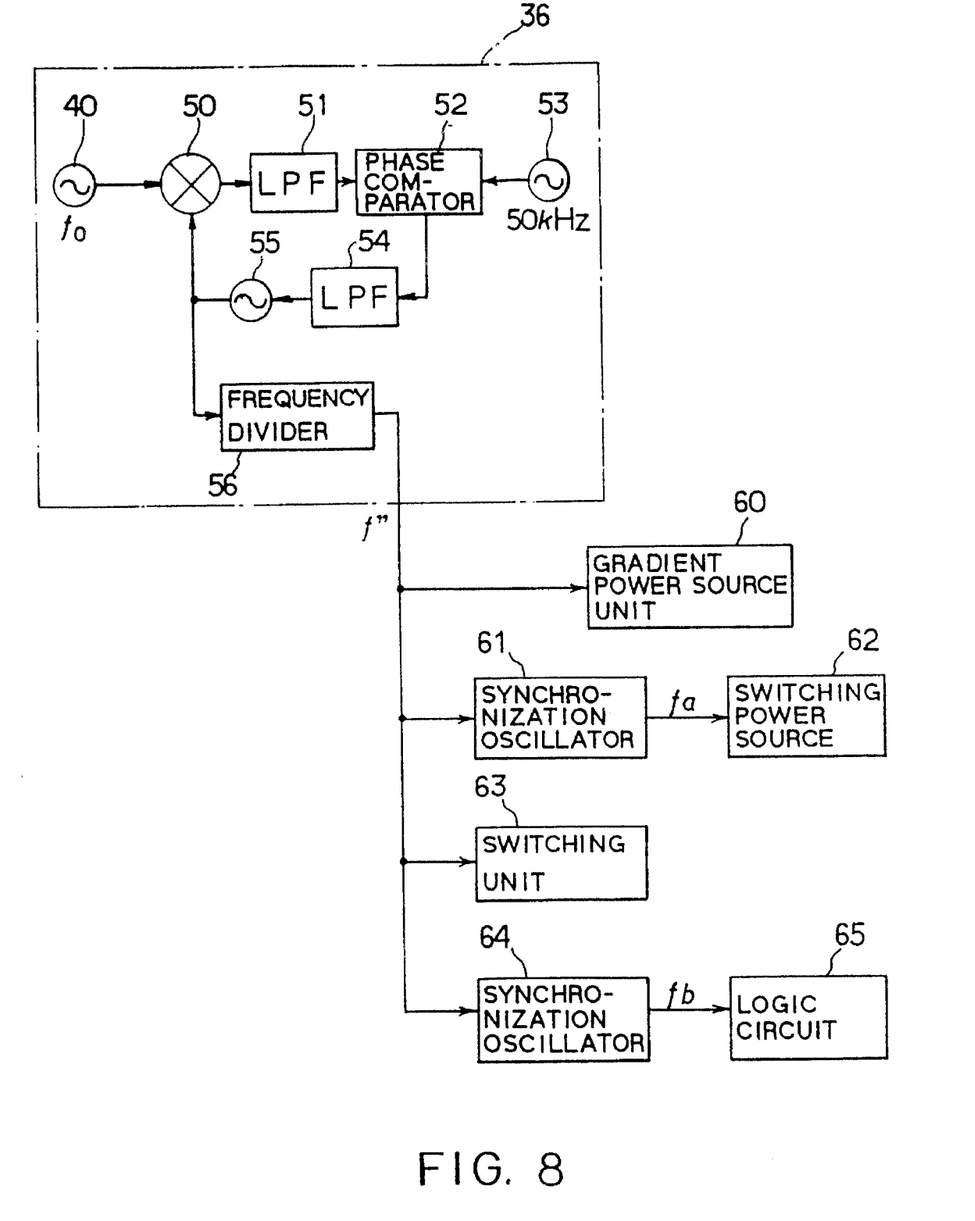
FIG. 8 is a block diagram of a switching signal generator and its output in a third embodiment of the present invention.
Figure 9:
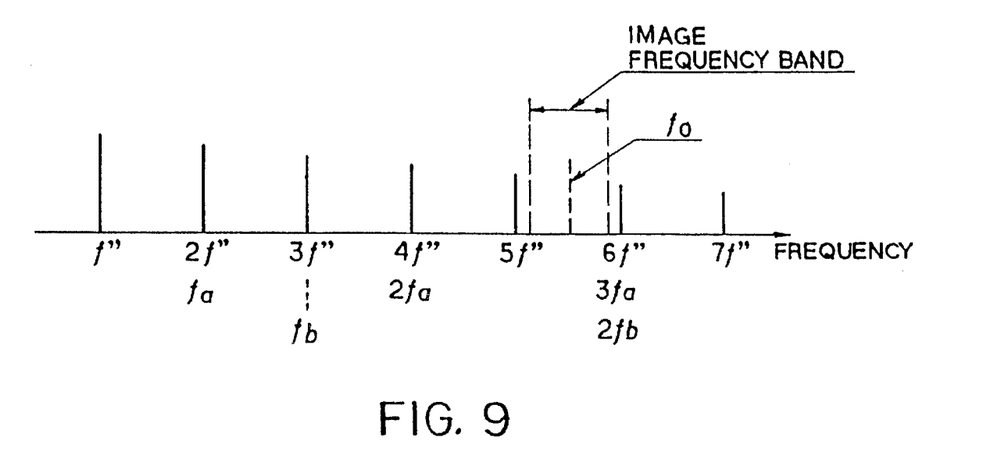
FIG. 9 is an illustration of the frequency spectrum in the third embodiment.

FIG. 8. illustrates a switching signal generator 36 which is used in a gradient power source and which forms a part of an MRI system, and shows also the destination of the switching frequency f". The switching signal generator 36 has the same construction as that in the second embodiment.

The switching signal of a frequency f" generated by the switching signal generator 36 is directly supplied as its one use to the gradient power source unit 60 (namely, three gradient power sources for x-, y- and z-gradient coils), which adopts the foregoing PWM control system. The switching signal of a frequency f" as its another use is supplied to a frequency multiplying synchronization oscillator 41 which outputs a multiplied frequency fa and delivers it to another switching power source 62. The switching power source 62 operates with the multiplied switching signal. The switching signal of the frequency f" is also supplied directly to a switching unit 63 of another use. Furthermore, the switching signal of the frequency f" is multiplied by another synchronization oscillator 64 and converted into a clock signal of a frequency fb. The clock signal is supplied to a digital logic circuit 65 for another use.

Consequently, the switching signals and the clock signals which are required in the MRI system are formed on the basis of the switching frequency of the gradient power source 36, so that these signals are synchronous with this base frequency or frequencies obtained through multiplication of the base frequency. Therefore, all the switching units and the clock units in the system operate in synchronization with these frequencies.

The base switching frequency f" has been determined so as not to fall within the image frequency band, so that the higher harmonics of the multiplied frequencies fa and fb, e.g., 3fa and 2fb, do not fall within the image frequency band in the frequency spectrum, as shown in FIG. 9.

Consequently, not only the noises attributable to spurious radiation caused by the switching operation but also the noises attributable to spurious radiation caused by the clock operation are exclude from the image, thereby ensuring high quality of the image with reduced S/N ratio. Furthermore, it becomes possible to easily use a switching regulator in an MRI system,.thus eliminating the necessity for the use of expensive and large-scale shunt regulator or series regulator which is employed in the conventional system. The use of switching type regulator naturally increases the power factor.

Figure 10:
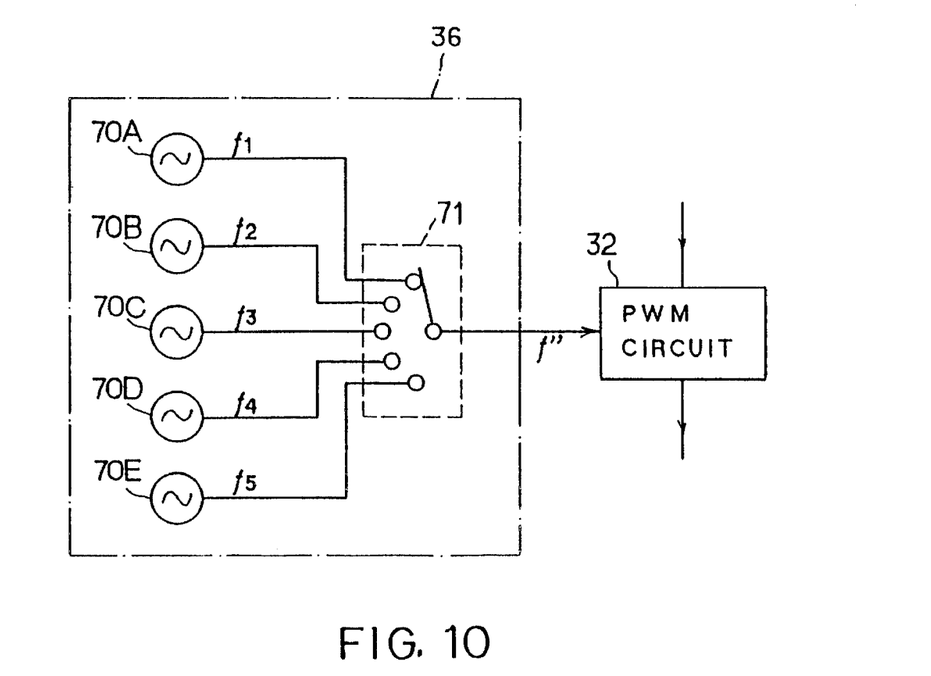
FIG. 10 is a block diagram representing another variation of the switching signal generator.

Another variation is shown in FIG. 10. The switching signal generator 36 shown in FIG. 10 comprises a plurality of oscillators 70A to 70E and a manually-operated switch 71. The oscillators 70A to 70E oscillates and supplies switching signals of predetermined slightly-changed frequencies f1 to f5 to the switch 71. The frequencies f1 to f5 are, for instance, 100 khz, 99.997 kHz, 99.994 kHz, 99.991 kHz and 99.988 kHz. The switch 71 will be switched to a desired switching position by hand. Accordingly, one of the switching signals of frequencies f1 to f5 is selected according to an operator's will and supplied to the PWM circuit 32 as a manually-adjusted switching signal f". This variation also makes it possible frequency control of the switching signal.

Still another variation is possible to use a variable frequency oscillator (VFO), which will oscillates depending on a received control signal. The oscillation frequency range is, for instance, a range of about 100 kHz. In such a case, the output of the VFO can be directly sent to the PWM circuit 32.

The switching signal generator of the present invention can be used not only for an MRI system, but also to other types of apparatuses such as multiplied communication circuit of PWM type telephone system, offering elimination or suppression of noise attributable to spurious radiation falling within the communication frequency band.

What we claim is:

1. A magnetic resonance imaging system characterized by an image frequency band having a center frequency which is a resonance frequency for reconstructing a magnetic resonance image:

an electric element;

a switching signal generator means for receiving an input switching signal having a first switching frequency with a harmonic frequency and for generating an output switching signal in response thereto, said output switching signal having a second switching frequency with another harmonic frequency, wherein said harmonic frequency of said input switching signal being within said image frequency band, and said another harmonic frequency of said output switching signal being outside of said image frequency band; and a switching device for receiving said output switching signal and for driving said electric element.

2. The magnetic resonance imaging system of claim 1, wherein the switching signal generator means further comprising means for pulse width modulating said input switching signal.

3. The magnetic resonance imaging system of claim 2, wherein the switching signal generator means comprises a gradient power source.

4. The magnetic resonance imaging system of claim 3, wherein said pulse width modulating means has an output coupled in common with other elements other than the gradient power source, each of the other elements using said output with each having a pulse signal associated with said output.

5. The magnetic resonance imaging system of claim 2, wherein the switching signal generator means further comprises a ring modulation circuit and a frequency divider circuit dividing an output of the ring modulation circuit to produce a synchronizing signal as a control signal for said pulse width modulating means.

6. The magnetic resonance imaging system of claim 2, wherein the switching signal generator means further comprises a phased locked loop circuit and a frequency divider circuit dividing an output of the phased locked loop circuit to produce a synchronizing signal as a control signal for said pulse width modulating means.

7. The magnetic resonance imaging system of claim 2, wherein the switching frequency is larger than the image frequency band.

8. The magnetic resonance imaging system of claim 2, wherein the switching signal generator means is a manually-operated device.

9. The magnetic resonance imaging system of claim 8, wherein the manually-operated device is a manually-operated switch.

\* \* \* \* \*